(12) United States Patent
Wang et al.

(10) Patent No.: US 7,521,341 B2
(45) Date of Patent: Apr. 21, 2009

(54) METHOD OF DIRECT DEPOSITION OF POLYCRYSTALLINE SILICON

(75) Inventors: Liang-Tang Wang, Tainan (TW); Chi-Lin Chen, Hsinchu (TW); I-Hsuan Peng, Hsinchu (TW); Jung-Fang Chang, Tainan (TW); Chin-Jen Huang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 129 days.

(21) Appl. No.: 11/270,862

(22) Filed: Nov. 9, 2005

(65) Prior Publication Data

US 2007/0105373 A1    May 10, 2007

(51) Int. Cl.
*H01L 21/36* (2006.01)
(52) U.S. Cl. ............... 438/488; 438/485; 257/E21.572
(58) Field of Classification Search ................ 438/488, 438/489, 490, 485; 427/527
See application file for complete search history.

(56) References Cited

U.S. PATENT DOCUMENTS

| 3,676,320 | A | * | 7/1972 | Christensen | ........... 204/192.12 |
| 5,677,236 | A | * | 10/1997 | Saitoh et al. | ................ 438/485 |
| 6,161,499 | A | * | 12/2000 | Sun et al. | ................ 118/723 E |
| 6,548,380 | B1 | * | 4/2003 | Goto et al. | ................ 438/485 |
| 2008/0188062 | A1 | * | 8/2008 | Chen et al. | ................ 438/483 |

OTHER PUBLICATIONS

Quinn et al., "Deposition and characterisation of silicon grown in a SiF4/SiH4/H2 mixture for TFT applications.", 1997, Thin Solid Films, vol. 296, pp. 7-10.*
Yugo et al., "Generation of diamond nuclei by electric field in plasma chemical vapor deposition", Mar. 1991, Applied Physics Letters, 58 (10), pp. 1036-1038.*
"Structural Properties of Polycrystalline Silicon Films Prepared at Low Temperature by Plasma Vapor Deposition" by Kakinuma et al., J. Appl. Phys., 70 (1991), 7374.
"Study of Polycrystalline Silicon Films Deposited by Inductive Couple Plasma Chemical Vapor Deposition" by Won et al., Journal of the Korean Physical Society, vol. 39, 123-126 (2001).

* cited by examiner

*Primary Examiner*—Alexander G Ghyka
*Assistant Examiner*—Reema Patel
(74) *Attorney, Agent, or Firm*—Alston & Bird LLP

(57) ABSTRACT

A method for forming a polysilicon film in a plasma-assisted chemical vapor deposition (CVD) system including a chamber in which a first electrode and a second electrode spaced apart from the first electrode are provided comprises providing a substrate on the second electrode, the substrate including a surface exposed to the first electrode, applying a first power to the first electrode for generating a plasma in the chamber, applying a second power to the second electrode during a nucleation stage of the polysilicon film for ion bombarding the surface of the substrate, and flowing an erosive gas into the chamber.

18 Claims, 4 Drawing Sheets

METHOD OF DIRECT DEPOSITION OF POLYCRYSTALLINE SILICON

BACKGROUND OF THE INVENTION

The present invention relates generally to a method of semiconductor fabrication, and more particularly, to a method of forming a polycrystalline silicon film by a plasma-assisted chemical vapor deposition ("CVD") process.

In the fabrication of flat panel display ("FPD") devices, thin film transistors ("TFTs") and liquid crystal cells, metal interconnects and other features are formed by depositing and/or removing multiple layers of conducting, semi-conducting and dielectric materials from a glass substrate. One of the conventional methods for fabricating a polycrystalline silicon (hereinafter polysilicon) TFT is solid phase crystallization ("SPC"). In LCD devices, since a normal glass substrate can only work at a temperature below 600° C., fabricating a polysilicon film directly under a high temperature will make the glass substrate twisted. The SPC method overcomes the high temperature issue by using an expensive quartz substrate. However, only a small size LCD panel can be made. In a method called biased-enhanced nucleation ("BEN"), nucleation of diamond on Pt or Pt alloy substrates at high density is possible by applying a bias voltage to the substrate in a plasma atmosphere that includes carbon at the beginning of diamond CVD. In the BEN method, for diamond growth, known CVD methods, such as microwave plasma CVD, radio frequency plasma CVD, hot filament CVD, DC plasma CVD methods, plasma jet, combustion, thermal CVD and the like can be used. An example of the BEN method can be found in "Generation of Diamond Nuclei by Electric Field in Plasma Chemical Vapor Deposition" by Yugo et al., Appl. Phys. Lett., 58 (1991), 1036. The BEN method is effective because the substrate surface is quickly supersaturated with carbon-containing species as ions containing carbon atoms are attracted to the substrate by an electric field due to the bias, and thus diamond nuclei are more readily formed and grown.

A low temperature polycrystalline silicon ("LTPS") process has been developed for manufacturing the TFT array of liquid crystal display ("LCD") devices. The low temperature polysilicon has the characteristic of faster electron mobility than the amorphous silicon (a-Si) over approximately 100 times. Consequently, each pixel of low temperature polysilicon has a faster response time and smaller outlined dimension compared with amorphous silicon.

Conventional methods for fabricating polysilicon TFTs at low temperature may include excimer laser annealing ("ELA") and CVD processes. The ELA method requires a lower crystallization temperature than the SPC method. However, the transient temperature provided by a laser may damage a polymeric substrate. Since polymeric substrates are used more often than glass substrates, the ELA method may still have a temperature issue. Furthermore, the ELA method may not be cost efficient in mass production because ELA equipment is expensive.

In the CVD method, a low temperature polysilicon film is formed by crystallizing an amorphous silicon film. Processing techniques used to create the TFT devices may include plasma-enhanced chemical vapor deposition ("PECVD") and the like. Plasma processing may be well suited for the production of TFT devices because of the relatively lower processing temperatures required to deposit films and the good film quality which results from plasma processes. Examples of the CVD method can be found in "Structural Properties of Polycrystalline Silicon Films Prepared at Low Temperature by Plasma Vapor Deposition" by Kakinuma et al., J. Appl. Phys., 70 (1991), 7374, and "Study of Polycrystalline Silicon Films Deposited by Inductive Couple Plasma Chemical Vapor Deposition" by Won et al., Journal of the Korean Physical Society, Vol. 39, 123~126 (2001). Although the CVD method may appear more advantageous than the SPC and ELA methods, published research papers have indicated that in the CVD method a polycrystalline silicon state of a film cannot be achieved until an amorphous incubation layer of approximately 100 to 1000 angstroms (Å) of the film is grown, which disadvantageously requires a longer fabrication time. The CVD method may be generally used for fabricating top-gate TFT devices. However, it is not suggested to fabricate bottom-gate TFT devices with the CVD method. A bottom-gate TFT device thus fabricated may suffer from threshold voltage ($V_{TH}$) shift due to stress, resulting in an early degradation. The CVD method therefore is not suitable for use in the fabrication of organic light emitting diodes (OLEDs). Furthermore, the CVD method may have a relatively low deposition rate of, for example, approximately 0.1 to 1 Å/sec, resulting in an undesirable throughput.

It is therefore desirable to have a method for fabricating polysilicon films that overcomes the disadvantages of the above-mentioned conventional methods in order to obtain a larger production yield, better uniformity over larger surfaces and thinner deposition layers.

BRIEF SUMMARY OF THE INVENTION

The present invention is directed to a method that obviates one or more problems resulting from the limitations and disadvantages of the prior art.

In accordance with an embodiment of the present invention, there is provided a method for forming a polysilicon film in a plasma-assisted chemical vapor deposition (CVD) system including a chamber in which a first electrode and a second electrode spaced apart from the first electrode are provided that comprises providing a substrate on the second electrode, the substrate including a surface exposed to the first electrode, applying a first power to the first electrode for generating a plasma in the chamber, applying a second power to the second electrode during a nucleation stage of the polysilicon film for ion bombarding the surface of the substrate, and flowing an erosive gas into the chamber.

Also in accordance with the present invention, there is provided a method for forming a polysilicon film in a plasma-assisted chemical vapor deposition (CVD) system including a chamber in which a first electrode and a second electrode spaced apart from the first electrode are provided that comprises providing a substrate on the second electrode, the substrate including a surface exposed to the first electrode, applying a first power to the first electrode for generating a plasma in the chamber, and applying a second power to one of the second electrode or the substrate during a nucleation stage of the polysilicon film for ion bombarding the surface of the substrate.

Further in accordance with the present invention, there is provided a method for forming a polysilicon film in a plasma-assisted chemical vapor deposition (CVD) system including a chamber in which a first electrode and a second electrode spaced apart from the first electrode are provided that comprises providing a substrate on the second electrode, the substrate including a surface exposed to the first electrode, generating a plasma in the chamber during a nucleation stage and a growth stage after the nucleation stage of the polysilicon film, ion bombarding the surface of the substrate during the nucleation stage of the polysilicon film, and chemically eroding the surface of the substrate.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
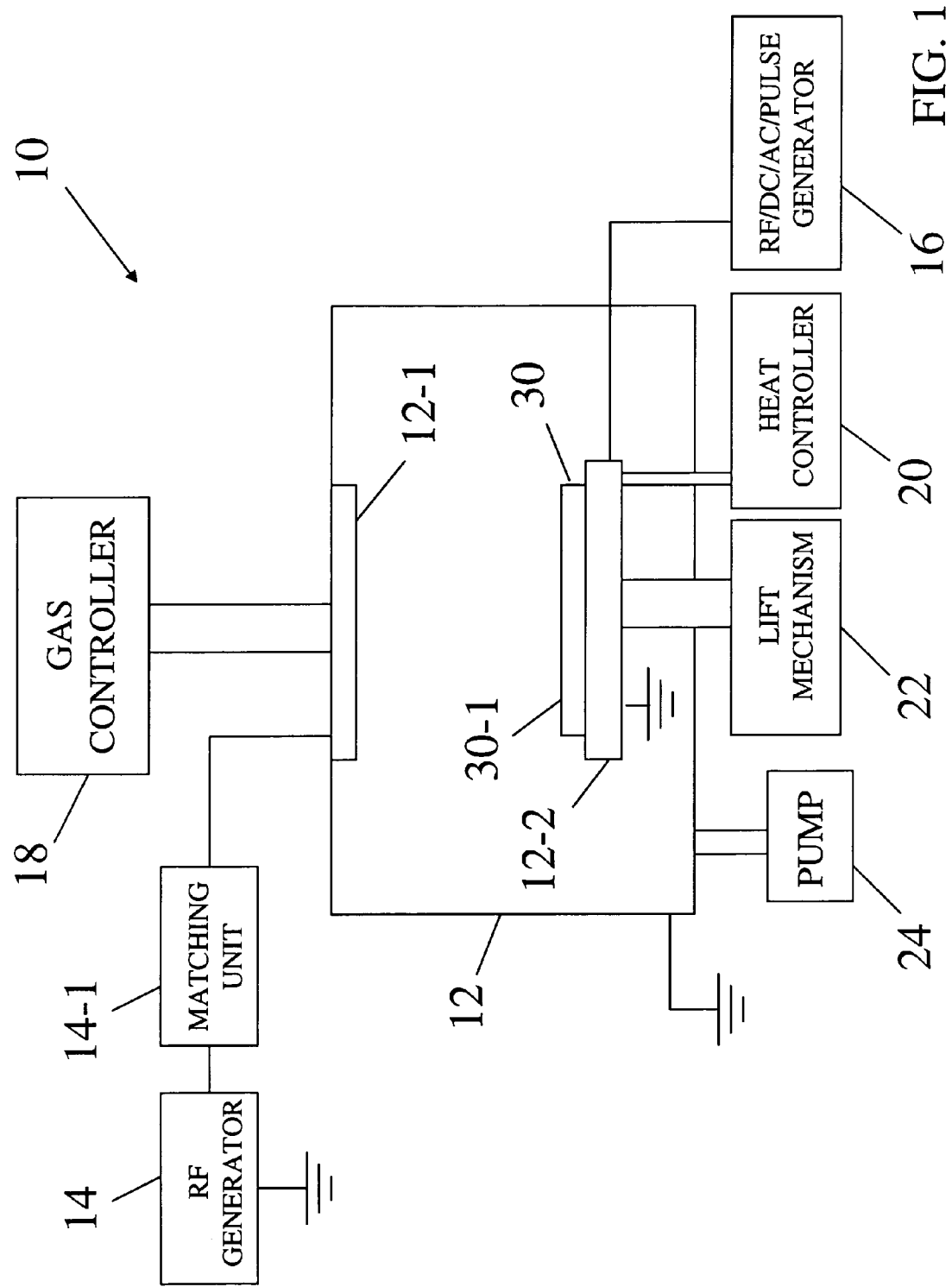
FIG. 1 is a schematic diagram of a system for forming a polysilicon film in accordance with one embodiment of the present invention.

FIG. 1 is a schematic diagram of a system 10 for forming a polysilicon film in accordance with one embodiment of the present invention. Referring to FIG. 1, system 10, a plasma assisted chemical reaction system, includes a chamber 12, a first power generator 14 and a second power generator 16. System 10, except second power generator 16, may include one of a model AKT-1600 PECVD system manufactured by Applied Komatsu Technology, a high density plasma CVD (HDPCVD) system manufactured by Applied Materials, Inc., or an inductively coupled plasma CVD (ICP-CVD) system. The present invention, however, is not limited to the above-mentioned systems and may be used with other commercially available deposition systems.

A substrate 30, either glass or a polymeric material, is placed in chamber 12 that is equipped with a pair of parallel plate electrodes including a first electrode 12-1 and a second electrode 12-2. First electrode 12-1 functions as a gas inlet manifold or shower head through which a reactant gas provided by a gas controller 18 flows into chamber 12. Second electrode 12-2, separated from first electrode 12-1 by several inches, functions to support or hold substrate 30. During deposition, a radio frequency (RF) voltage provided by first power generator 14 through a matching network 14-1 is applied to first electrode 12-1 to produce a plasma within the reactant gas in chamber 12. The plasma causes the reactant gas to decompose and deposit a layer of material onto an exposed surface 30-1 of substrate 30. Second power supply 16 provides an RF voltage, a direct current (DC) voltage, an alternating current (AC) voltage or a pulse voltage to second electrode 12-2 to create an electrical field between first electrode 12-1 and second electrode 12-2. The deposition process and operation of second power supply 16 will be later discussed in detail by reference to FIG. 2.

System 10 further includes a heat controller 20, a lift mechanism 22 and a pump 24. Heat controller 20 powers a heater (not shown) for heating substrate 30 during deposition to achieve or maintain second electrode 12-2 at an appropriate temperature level. Lift mechanism 22 is provided to support second electrode 12-2 at an appropriate elevation level. Pump 24 is used to evacuate chamber 12 to a state of vacuum.

Figure 2:
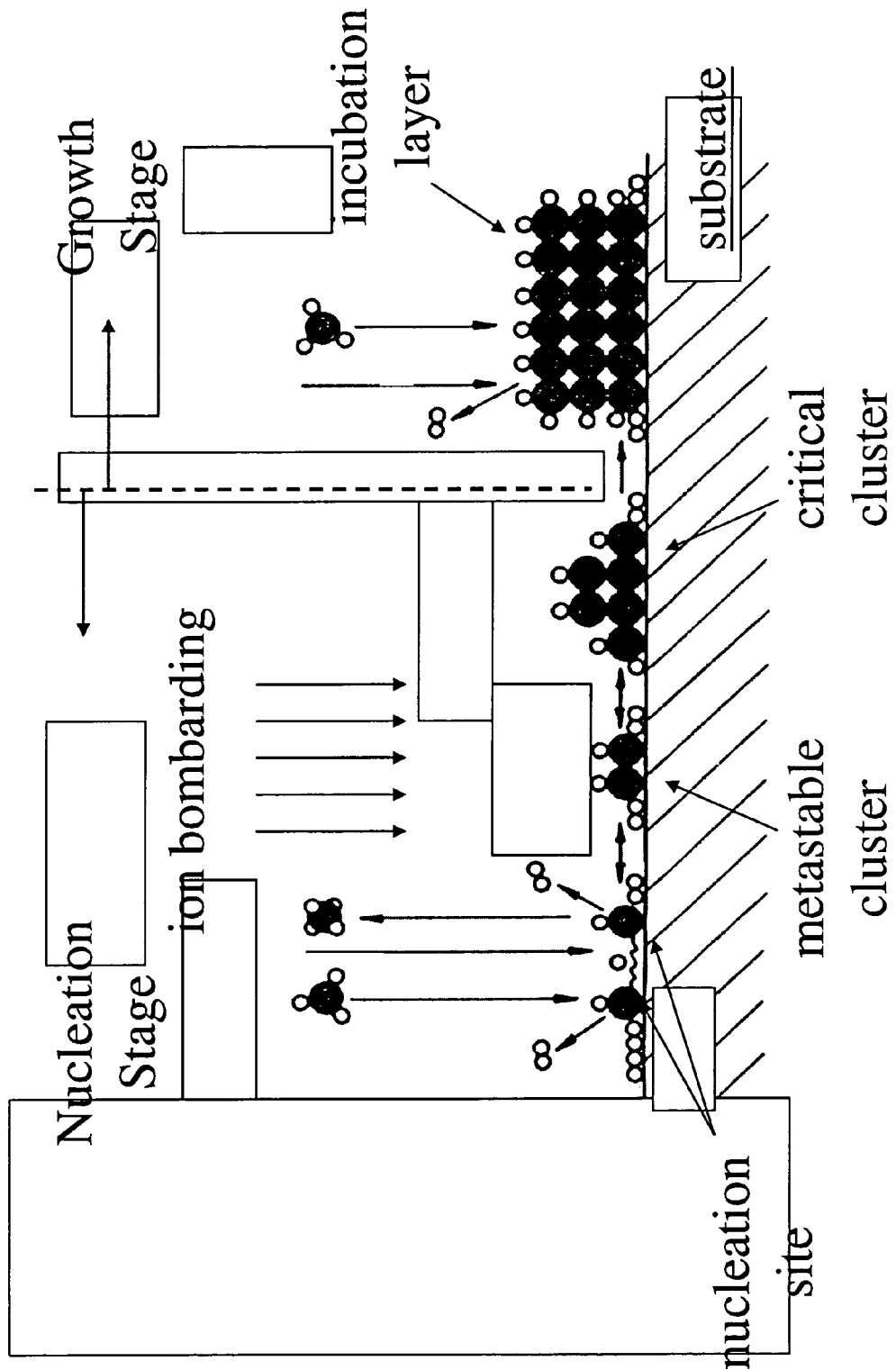
FIG. 2 is a schematic diagram illustrating a method for forming a polysilicon film in accordance with one embodiment of the present invention.

FIG. 2 is a schematic diagram illustrating a method for forming a polysilicon film in accordance with one embodiment of the present invention. The deposition process is a result of chemical reactions between reactive molecular precursors and substrate 30. Initial atoms and molecules that will constitute the film are delivered as precursors, which are fed from gas controller 18 shown in FIG. 1. The desired reactions are to deposit a pure film on surface 30-1 of substrate 30 and eliminate extra atoms or molecules that comprise the precursors.

Referring to FIG. 2, the deposition process at least includes a nucleation stage and a growth stage. The nucleation stage is assumed when a film of stable material is deposited on nucleation sites on surface 30-1 of substrate 30. Substrate 30 has many bonding locations on surface 30-1, where chemical binding occurs during deposition, causing gaseous atoms and molecules to chemically attach to surface 30-1. However, the reaction does not occur at all of the potential bonding locations. Generally, defect sites, which have irregular topology or impurities, are likely to trap the molecular precursors. To provide more of such defect sites, also referring to FIG. 1, second power supply 16 provides a bias voltage to second electrode 12-2 during the nucleation stage to generate an electrical field between first electrode 12-1 and second electrode 12-2, resulting in an ion bombarding effect on surface 30-1. In another embodiment, second power supply 16 provides a bias voltage to substrate 30 during the nucleation stage. The ion bombarding facilitates formation of defect sites for initial reaction products, that is, nucleation seeds. The nucleation seeds are immobile and diffusing molecular precursors have a high probability to collide with them and react, resulting in the growing of metastable clusters. As the metastable clusters grow larger, most of the collisions occur at the boundaries of the metastable clusters. As the metastable clusters further grow three-dimensionally, most of the binding and reaction processes occur on the upper surfaces of the metastable clusters, resulting in the formation of critical clusters. During the growth stage, eventually, the vertical growth of the critical clusters results in the formation of grains, which finally coalesce into a continuous film.

In one embodiment according to the present invention, the RF power provided by first power supply is approximately 600 watts at a frequency of approximately 13.56 MHz. The density of plasma generated is approximately $10^{11}$ to $10^{13}$ cm$^{-3}$, which facilitates the nucleation with a shorter incubation time and thinner incubation layer as compared to a lower density of one or two orders less. Second power supply 16, in one aspect, provides an RF power ranging from approximately 100 to 1000 watts at 13.56 MHz. In another aspect, second power supply 16 provides a DC bias ranging from approximately 0 to 600 volts. In still another aspect, second power supply 16 provides an AC bias ranging from approximately 0 to 500 volts at a frequency of approximately 0 to 400 Hz. In yet another aspect, second power supply 16 provides a pulse voltage, for example, in the form of a square wave transmitting in a single direction, i.e., either positive or negative. The pulse voltage ranges from approximately 0 to 500 volts at a frequency of approximately 0 to 400 Hz with a pulse width of approximately 1 to 10 µm/sec. Chamber 12 is evacuated to a pressure of approximately $10^{-3}$ Torr. The reactant gases include silane ($SiH_4$), hydrogen ($H_2$) and Argon (Ar). In one embodiment, Ar is approximately 0 to 50 sccm, $SiH_4$ is approximately 50 sccm, and the ratio of $SiH_4$ to $H_2$ is approximately 1:10 to 1:100. Substrate 30 is maintained at a temperature of approximately 25° C. to 500° C. The incubation layer ranges approximately from 300 Å to 500 Å, under which thickness the amorphous silicon is crystallized into polycrystalline silicon.

During the growth stage, a chemical erosion process is conducted to remove weakly bonded amorphous or silicon molecules on the upper surface of the incubation layer. In another embodiment, however, the chemical erosion process is conducted during the nucleation stage. Since separated nucleation sites can result in the formation of grain boundaries and voids on surface 30-1 of substrate 30, where potential bonding sites failed to bond with the molecular precursors, the removal of the weakly bonded materials helps to reduce the incubation time and the incubation layer thickness. An erosive gas including $SiF_4$ and $H_2$ or $SF_6$ and $H_2$ is used in the chemical erosion process. In one embodiment according to the present invention, the ratio of $SiF_4$ to $H_2$ ranges from approximately 1:10 to 1:100. In one aspect, $SiF_4$ is 1 sccm and $H_2$ is 10 sccm. In another embodiment, during the growth stage, second power supply 16 provides a DC bias of approximately 50 volts to second electrode 12-2 or substrate 30 in order to achieve a condensed polysilicon film. In still another embodiment, second power supply 16 provides an AC bias ranging from approximately 0 to 50 volts at a frequency of approximately 0 to 400 Hz. In yet another embodiment, second power supply 16 provides a pulse voltage of approximately 0 to 50 volts at a frequency of approximately 0 to 400 Hz with a pulse width of approximately 1 to 10 µm/sec. Furthermore, during the growth stage, the reactant gas Ar is cut off, $SiH_4$ is maintained at approximately 50 sccm, and the ratio of $SiH_4$ to $H_2$ is approximately 1:10 to 1:100.

Figure 3B:
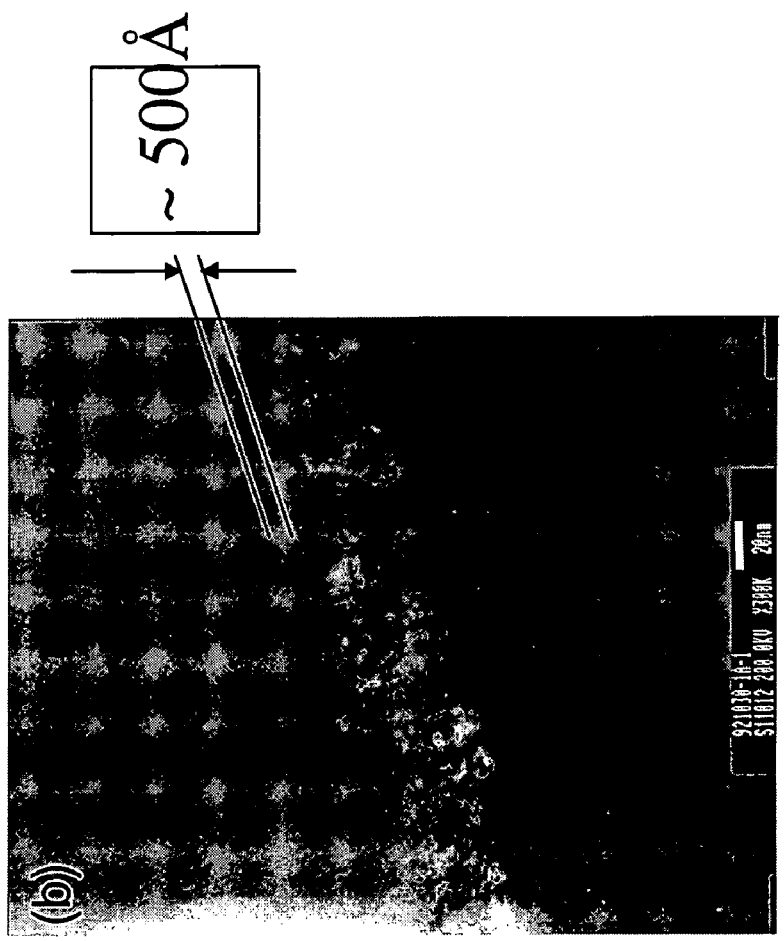
FIGS. 3A and 3B are TEM (transmission electron microscope) photo diagrams respectively showing a plane view and a cross-sectional view of a polysilicon film formed by a method in accordance with one embodiment of the present invention.
Figure 3A:
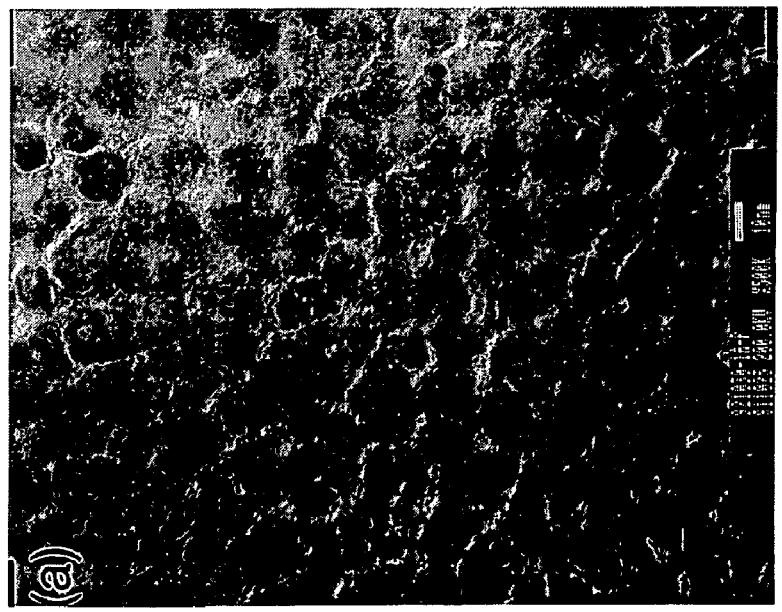

FIGS. 3A and 3B are TEM (transmission electron microscope) photo diagrams respectively showing a plan view and a cross-sectional view of a polysilicon film formed by a method in accordance with one embodiment of the present invention. Referring to FIG. 3B, an LTPS state of the film is achieved when the film is only grown to approximately 500 Å.

Figure 4:
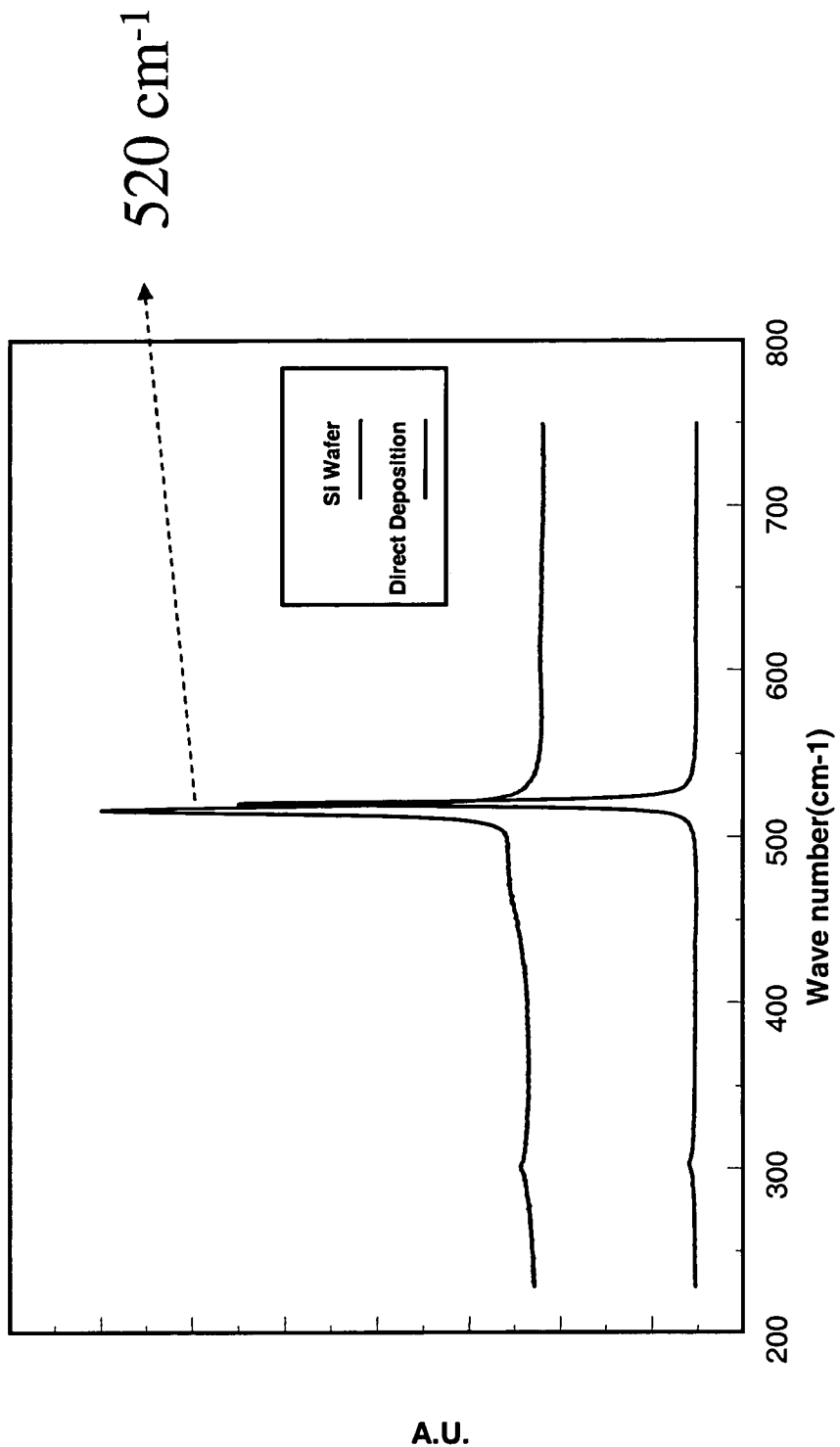
FIG. 4 is a plot of a Raman spectrum analysis on the polysilicon film shown in FIGS. 3A and 3B.

FIG. 4 is a plot of a Raman spectrum analysis on the polysilicon film shown in FIGS. 3A and 3B. Referring to FIG. 4, a signal occurs at the wave number of 520 $cm^{-1}$, which indicates that a polycrystalline silicon has been formed.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of the steps in the order written, and one skilled in the art can readily appreciate that the sequences may be varied and still remain within the spirit and scope of the present invention.

We claim:

1. A method for forming a polysilicon film in a plasma-assisted chemical vapor deposition (CVD) system including a chamber in which a first electrode and a second electrode spaced apart from the first electrode are provided, the method comprising:
    providing a substrate on the second electrode, the substrate including a surface exposed to the first electrode;
    applying a first power to the first electrode for generating a plasma in the chamber;
    applying a first direct current (DC) voltage to one of the second electrode or the substrate during a nucleation stage of the polysilicon film for ion bombarding the surface of the substrate; and
    applying a second DC voltage to the second electrode during a growth stage of the polysilicon film after the nucleation stage.

2. The method of claim 1, further comprising applying a DC voltage in the range of approximately 0 to 600 volts to the second electrode during the nucleation stage of the polysilicon film.

3. The method of claim 1, further comprising maintaining the substrate at a temperature in the range of approximately 25° C. to 500° C.

4. The method of claim 1, further comprising providing one of a glass substrate or a polymeric substrate.

5. The method of claim 1, further comprising generating a plasma of a density in the range of approximately $10^{11}$ to $10^{13} cm^{-3}$.

6. The method of claim 1, further comprising flowing an erosive gas including one of $SiF_4$ and $H_2$ or $SF_6$ and $H_2$ to the chamber.

7. The method of claim 1, further comprising flowing an erosive gas including $SiF_4$ and $H_2$ at a ratio ranging from approximately 1:10 to 1:100.

8. The method of claim 1, further comprising flowing an erosive gas into the chamber during the nucleation stage of the polysilicon film.

9. The method of claim 1, further comprising flowing an erosive gas into the chamber during a growth stage of the polysilicon film after the nucleation stage of the polysilicon film.

10. The method of claim 8, further comprising flowing $SiH_4$ and $H_2$ gases into the chamber at a ratio ranging from approximately 1:10 to 1:200.

11. The method of claim 9, further comprising flowing $SiH_4$ and $H_2$ gases into the chamber at a ratio ranging from approximately 1:10 to 1:200.

12. The method of claim 8, further comprising flowing Argon (Ar), silane ($SiH_4$) and $H_2$ gases into the chamber.

13. The method of claim 9, further comprising flowing silane ($SiH_4$) and $H_2$ into the chamber.

14. A method for forming a polysilicon film in a plasma-assisted chemical vapor deposition (CVD) system including a chamber in which a first electrode and a second electrode spaced apart from the first electrode are provided, the method comprising:
    providing a substrate on the second electrode, the substrate including a surface exposed to the first electrode;

generating a plasma in the chamber during a nucleation stage and a growth stage after the nucleation stage of the polysilicon film;

applying a first direct current (DC) voltage to one of the second electrode or the substrate for ion bombarding the surface of the substrate during the nucleation stage of the polysilicon film;

applying a second DC voltage to the second electrode during the growth stage of the polysilicon film; and chemically eroding the surface of the substrate.

15. The method of claim 14, further comprising flowing an erosive gas including one of $SiF_4$ and $H_2$ or $SF_6$ and $H_2$ into the chamber during the nucleation stage of the polysilicon film.

16. The method of claim 14, further comprising flowing an erosive gas including one of $SiF_4$ and $H_2$ or $SF_6$ and $H_2$ into the chamber during the growth stage of the polysilicon film.

17. The method of claim 14, further comprising flowing an erosive gas into the chamber including $SiF_4$ and $H_2$ at a ratio ranging from approximately 1:10 to 1:100.

18. The method of claim 14, further comprising generating a plasma of a density in the range of approximately $10^{11}$ to $10^{13}$ $cm^{-3}$.

* * * * *